United States Patent
Saputro et al.

(10) Patent No.: US 6,762,368 B2
(45) Date of Patent: Jul. 13, 2004

(54) REDUCING INDUCTANCE OF A CAPACITOR

(75) Inventors: Stephanus D. Saputro, Austin, TX (US); Lan Zhang, Austin, TX (US)

(73) Assignee: Dell Products L.P., Round Rock, TX (US)

(*) Notice: Subject to any disclaimer, the term of this patent is extended or adjusted under 35 U.S.C. 154(b) by 388 days.

(21) Appl. No.: 09/905,474

(22) Filed: Jul. 13, 2001

(65) Prior Publication Data

US 2003/0035277 A1 Feb. 20, 2003

(51) Int. Cl.[7] .................................................. H05K 7/06
(52) U.S. Cl. ........................ 174/260; 174/255; 361/794
(58) Field of Search ............................... 174/255, 260; 361/792–795, 803

(56) References Cited

U.S. PATENT DOCUMENTS 4,739,448 A * 4/1988 Rowe et al. ................. 361/719
6,353,540 B1 * 3/2002 Akiba et al. ................. 361/794
6,512,680 B2 * 1/2003 Harada et al. ............... 361/777
6,535,398 B1 * 3/2003 Moresco ...................... 361/792
2003/0024732 A1 * 2/2003 Ninomiya .................... 174/255

OTHER PUBLICATIONS

David A. Baranauskas and Douglas E. Wallace, Jr., "Capacitive Structure for Via Impedance Tuning"; Sep. 14, 1999, Ser. No. 09/395,788.
Doreen S. Fisher and Thad McMillian, "Printed Circuit Assembly Having Conductive Pad Array With In-Line Via Placement", Jun. 28, 2000, Ser. No. 09/605,905.

* cited by examiner

Primary Examiner—John B. Vigushin
(74) Attorney, Agent, or Firm—Baker Botts L.L.P.

(57) ABSTRACT

The inductance of the capacitor is reduced by connecting the capacitor directly to a via. In one embodiment inductance of a capacitor is reduced by a plurality of via, the number of via greater than the number of electrical couplings from the voltage pad to the voltage plane. In one embodiment the capacitor has a ground pad of a minimum size. In another embodiment the capacitor is electrically coupled to a trace having a length reduced to minimize inductance.

31 Claims, 8 Drawing Sheets

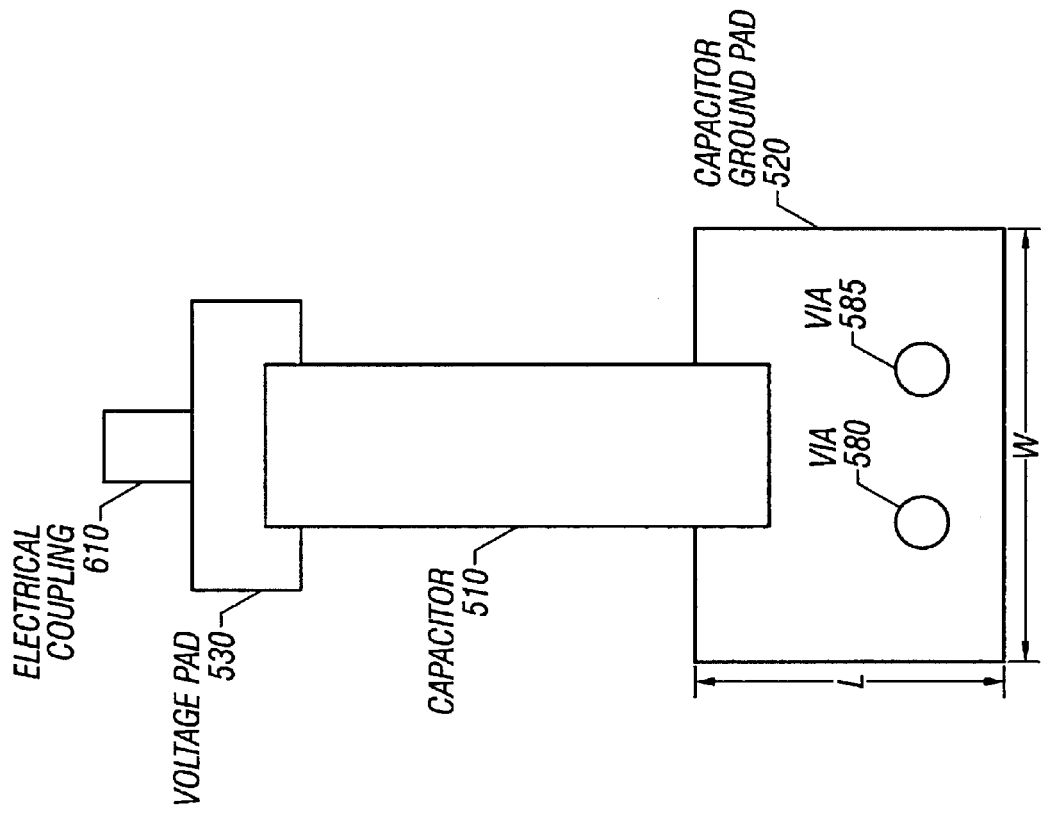
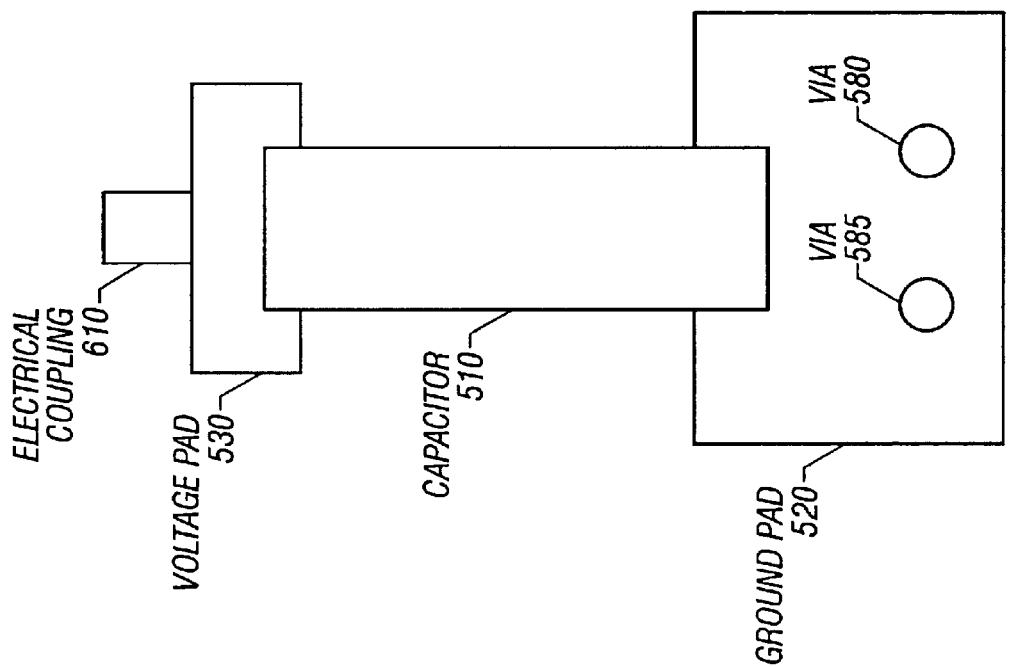

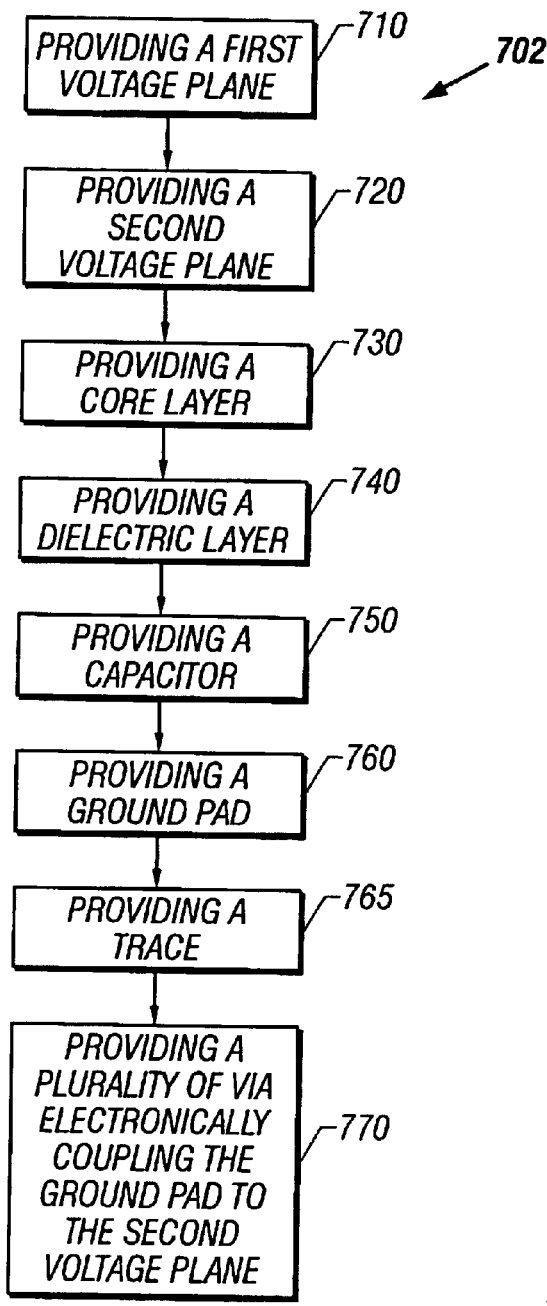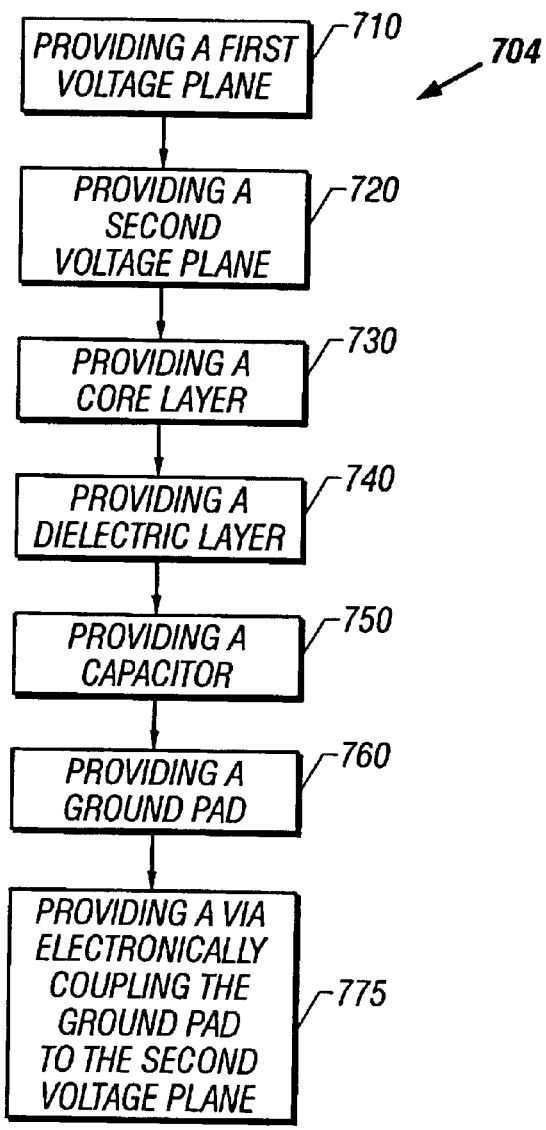
FIG. 7A
FIG. 7B

REDUCING INDUCTANCE OF A CAPACITOR

BACKGROUND OF THE INVENTION

1. Field of the Invention

The present invention relates to the field of decreasing the inductance of a capacitor. More specifically, the present invention relates to decreasing the inductance of a capacitor, such as a bypass capacitor, mounted on the surface of an integrated circuit board.

2. Description of the Related Art

Computer systems are information handling electronic systems which can be designed to give independent computing power to one user or a plurality of users. Computer systems may be found in many forms including, for example, mainframes, minicomputers, workstations, servers, personal computers, internet terminals, and notebooks. Computer systems include desk top, floor standing, rack mounted, or portable versions. A typical computer system includes at least one system processor, associated memory and control logic, and a number of peripheral devices that provide input and output for the system. Such peripheral devices may include display monitors, keyboards, mouse-type input devices, floppy and hard disk drives, CD-ROM drives, printers, network capability cards, terminal devices, modems, televisions, sound devices, voice recognition devices, electronic pen devices, and mass storage devices such as tape drives, CD-R drives, or DVDs.

Components of a computer system or other electronic system may be operably coupled to each other by computer busses or other types of signal lines. Computer busses typically include a plurality of signal lines which are current pathways for allowing electronic signals to propagate along the bus. The signal lines of a computer system can be implemented as signal traces either on a circuit board or embedded in a circuit board.

Computer systems are typically assembled using circuit boards on which integrated circuits have been mounted. It is also known to include a voltage plane and a reference voltage plane (sometimes referred to as a "ground plane") in an integrated circuit board. It is also known to incorporate a via, or conductive path, which can be used to electrically couple surface mounted structures, such as capacitors, with a voltage plane or ground plane.

As computer bus speeds have increased, the impedance of the signal paths of the busses has become more significant in the operation of the bus and accordingly the electronic system. Transmission rates between a memory controller and memory models may reach as high 800 MHz. This high data transfer rate is achieved in part by requiring that the physical characteristics of the bus between the memory controller and memory modules be within certain parameters. For example, under a specification for a memory module licensed by RAMBUS INC™ the impedance of the signal paths between the memory controller and a memory module is specified at 28 ohms.

Memory busses may utilize electrically conductive vias to route the signals among embedded signal layers in a circuit board and trace signal layers on the planar surface of the circuit board. A typical via extending through a 62 mil thick circuit board exhibits an impedance of about 40 to 60 ohms, depending on the via diameter, pad sizes, and the position of the signaling layers that the via electrically couples. The impedance of the via and the internal impedance of a surface mounted structure, such as a capacitor, are cumulative. Higher impedance may lower the quality of signal transmission of the memory bus due to signal/noise margin degradation.

It is known that impedance is related capacitance and inductance. The relationship is understood to be given in Equation 1. From Equation 1 it can be seen that increasing the capacitance decreases impedance. Increasing capacitance can be accomplished by adding capacitors in parallel. However increasing the number of capacitors requires additional area on the surface of an integrated circuit board and can increase cost to the manufacturer and consumer.

$$Z = \frac{1}{jwC} + jwL \qquad \text{Equation 1}$$

Where: Z represents impedance
C represents capacitance
L represents inductance
w represents frequency; and
j represents the imaginary part of the complex number It is known that increasing the ground pad size increases capacitance represented by C in Equation 1. As shown in Equation 1 above, increasing C decreases impedance. Therefore increasing the ground pad size decreases impedance. It is also known that inductance is proportional to the length of the trace. The length of the trace can be represented by L in Equation 1 above. Therefore, from Equation 1 it can be seen that decreasing the trace length also decreases the total impedance.

U.S. patent application Ser. No. 09/395,788 filed on Sep. 14, 1999 titled "Capacitive Structure for Via Impedance Tuning" (referred to as the "788 patent") naming inventors David A. Baranauskas and Douglas E. Wallace, Jr. teaches tuning the impedance of a via. However methods may be available which reduce the impedance more than the method taught by the '788 patent. Also, methods of reducing the impedance of a capacitor may be developed which are less expensive and may be implemented in conjunction with the method taught in the '788 patent.

Similarly, U.S. patent application Ser. No. 09/605,905 (the "905 application") filed on Jun. 28, 2000 titled "Printed Circuit Assembly having Conductive Pad Array with In-Line Via Placement" naming Doreen S. Fisher and Thad McMillian as inventors, inventors teaches a conductive pad array with an in-line via placement. However this disclosure teaches a placement of vias which provides additional space on the surface of the integrated circuit board. The '905 application does not teach a means to reduce inductance of capacitors.

The problem of impedance is noticed in determining the number of capacitors necessary to couple a voltage plane and a ground plane. Typically, the voltage plane and ground plane are adjacent and parallel, separated only by the core plane. This configuration of the voltage plane to the ground plane provides a low impedance path for a returning signal. This low impedance path minimizes the noise at high frequency. When a high frequency current (sometimes called a displacement current) is induced from the voltage plane to the ground plane through a capacitor it is said the signal "jumps" or "bypasses" the conductive path. The capacitor through which the displacement current flows is called a "bypass" capacitor.

FIG. 1 shows a cross-sectional view of a capacitor in an operational configuration on integrated circuit board 100. In the configuration shown in FIG. 1, the integrated circuit board includes the following; dielectric layer 170, voltage plane 140, core layer 160 and ground plane 150. Voltage plane 140 and ground plane 150 are parallel and are typically separated by core layer 160. In many computers, voltage plane 140 is maintained at a pre-determined voltage over ground plane 150. For example, a Dell© Dimension™ computer manufactured and sold by Dell Computer Corporation of Austin, Tex. has a voltage plane normally operating at 3.3 volts above the ground plane.

Still referring to FIG. 1, capacitor 110 is electrically coupled to voltage pad 130 as shown. Voltage pad 130 is electrically coupled to voltage plane 140 by some means (not shown). Similarly, ground pad 120 is electrically coupled to trace 190. Trace 190 is coupled by some means (not shown) to ground plane 150.

In the prior art the Institute of Electrical and Electronic Engineers (IEEE) has adopted a standard configuration of a surface mounted capacitor. The standard configuration provides information to allow manufacturers and designers to provide uniform connections from a surface mounted capacitor to a voltage plane. For a single capacitor, it is known to have an equal number of connections from the voltage plane to the voltage pad and the ground plane to the ground pad.

Referring to FIG. 2, capacitor 210 is shown with voltage pad 220. Voltage pad 220 is shown electrically coupled to trace 230. Trace 230 is shown coupled to via 240. Typically, the trace is located on the surface of the integrated circuit board. The industry standard calls for a minimum 25 mil trace width and a corresponding trace length of 50 mils. (Note, a "mil" is a commonly used unit of measurement representing 0.001".) Similarly, the industry standard configuration specifies 46 mils as the diameter of a via connecting the capacitor to a planar surface within the integrated circuit board. However, even in the configuration adopted by the IEEE the impedance of a capacitor is unacceptably high. High impedance is particularly noticeable for bypass capacitors at the operating frequencies of computers being currently manufactured.

What is needed is a means to decrease the impedance of capacitors mounted on integrated circuit boards. A means of decreasing impedance of board mounted capacitors operating over 100 MHZ would be particularly beneficial.

SUMMARY OF THE INVENTION

In accordance with the present disclosure, a method is taught of reducing the inductance of a capacitor. The inductance of the capacitor is reduced by connecting the capacitor directly to a via. In one embodiment inductance of a capacitor is reduced by a plurality of via, the number of via greater than the number of electrical couplings from the voltage pad to the voltage plane. Specifically, inductance of a capacitor having less than six via is reduced in a range from 400 MHz to 800 MHz. In one embodiment the capacitor has a ground pad of a minimum size. In another embodiment the capacitor is electrically coupled to a trace having a length reduced to minimize inductance.

The disclosure teaches a method of designing an integrated circuit board having a capacitor to reduce the inductance of the integrated circuit board. The disclosure also teaches a computer system manufactured with a circuit board including a capacitor having a reduced impedance.

The foregoing is a summary and this contains, by necessity, simplifications, generalizations and omissions of detail; consequently, those skilled in the art will appreciate that the summary is illustrative only and is not intended to be in any way limiting.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 5B illustrates one embodiment of the present disclosure. FIG. 5B shows a portion of printed circuit board 502. In the embodiment depicted in FIG. 5B, trace 590 is shown embedded in the surface of printed circuit board 502. In the embodiment shown in FIG. 5B, ground pad 520 is electrically coupled to trace 590 which has a reduced length to minimize inductance. Trace 590 is electrically coupled to via 580. As previously discussed (refer to Equation 1) reducing the inductance of trace 590 reduces overall impedance.

FIG. 6A shows a top view of a capacitor having a ground pad and a plurality of via. FIG. 6B shows a capacitor having a ground pad of minimum size and a plurality of via.

FIGS. 7A–7C are flow diagrams showing implementations of the method. FIG. 7A shows a flow diagram of an embodiment to design a circuit board having a trace and a capacitor having a plurality of via. FIG. 7B shows an embodiment having a trace of reduced length. FIG. 7C shows an embodiment having a ground pad of minimum size.

DETAILED DESCRIPTION

The following sets forth a detailed description of a mode for carrying out the disclosure. The description is intended to be illustrative and should not be taken to be limiting. A method of reducing the impedance of a capacitor is by eliminating a trace or minimizing the length of a trace, is disclosed. The method can include designing the capacitor to connect directly to a via in a printed circuit board. Alternately, the method includes connecting a capacitor to a trace in the printed circuit board of limited length to reduce impedance. The method can also include assembling an integrated circuit board with a trace of reduced length, or eliminate, to reduce inductance. The disclosure includes capacitors, integrated circuit boards and computers designed or assembled with the method disclosed.

Figure 2:
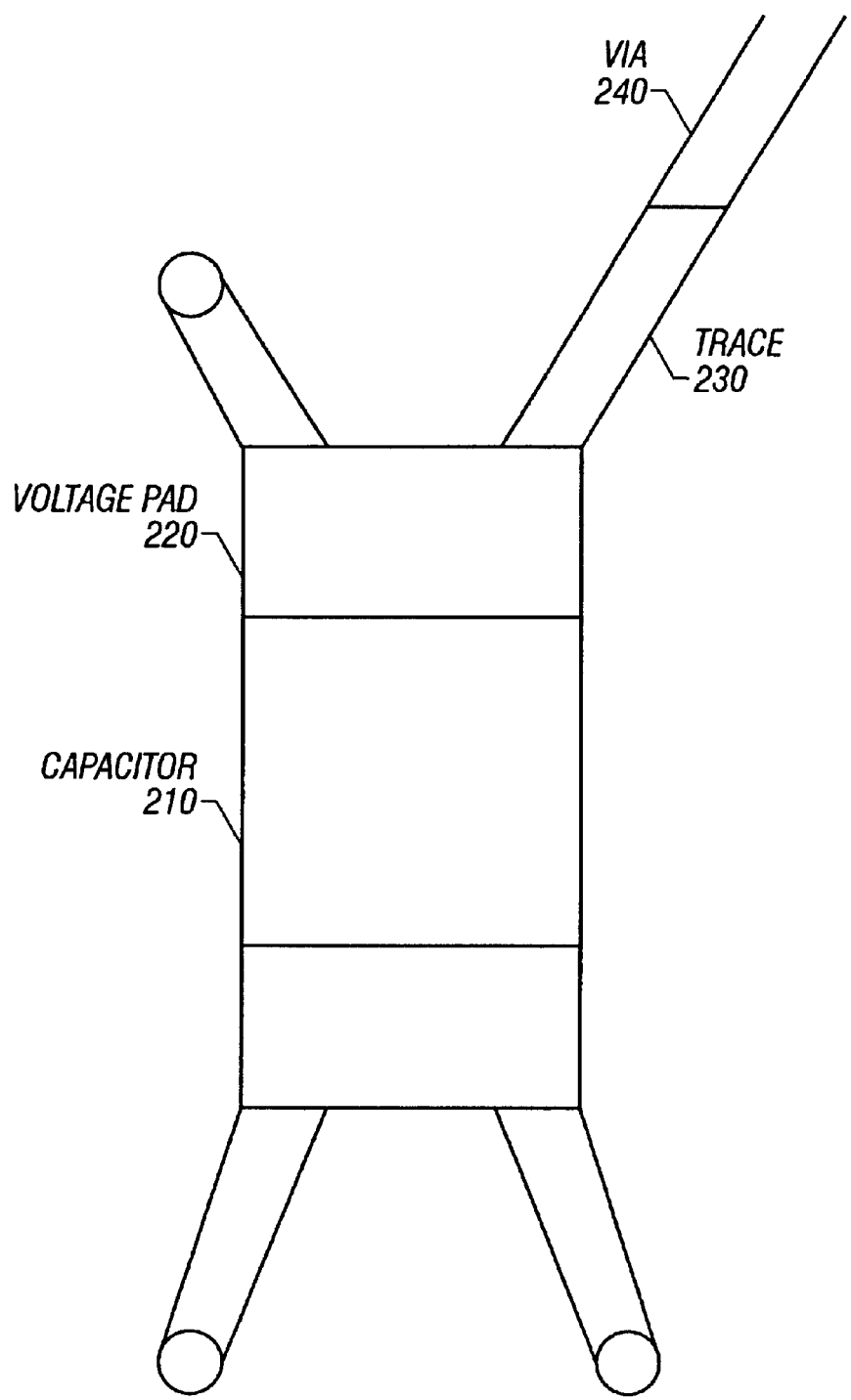
FIG. 2 shows a top view of a capacitor as known in the related art.

Referring briefly to FIG. 2, a capacitor is shown with electrical connections to a power pad. The diameter (50 mils) and length (50 mils) of the trace are specified. The trace can be a conductive path in the surface of the integrated circuit board. FIG. 2 shows trace 230 connected to via 240. The industry specification suggests a via diameter of 46 mils. However, FIG. 2 does not show any connection from the capacitor or capacitor pad to the ground plane of the integrated circuit.

Experimentation predicts reduced impedance of capacitors having certain electrical couplings in the range of operating frequencies above 100 MHz. The experimentation considered various configurations of electrical couplings and ground pad sizes. For example, the size of the ground pad was reduced by approximately ⅓ from the standard promulgated by the IEEE. A small decrease in impedance was noted, but the decrease was not deemed sufficient for commercial application.

Figure 3:
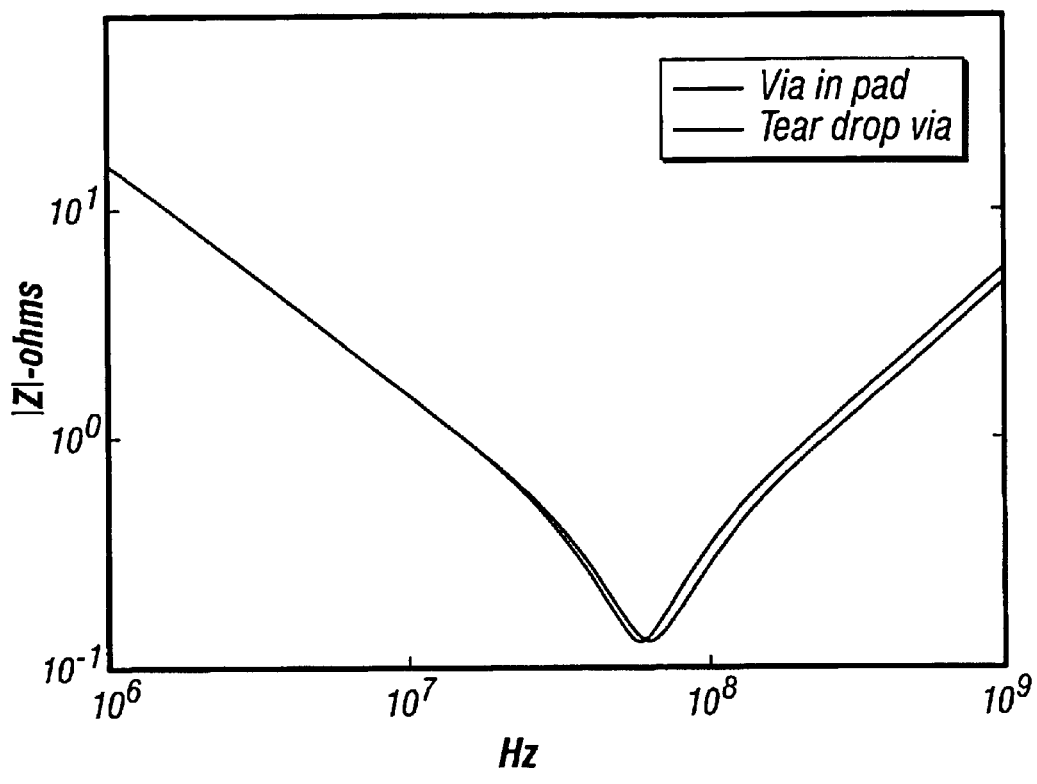
FIG. 3 is a graph showing predicted experimental results. The graph plots impedance of a surface mounted capacitance versus operating frequency.

Another experiment considered using a via that was not round but was oval, or tear drop, shaped. In this experiment, the impedance initially decreased but after 100 MHz began to increase. This experiment was not considered successful due to the increase in impedance in the operational frequency when a decrease was sought. The results of this experiment are shown in FIG. 3 and depict an increase from less than one ohm to over five ohms in the operational frequency above 100 MHz. An increase in impedance is undesirable for the reasons previously discussed.

Another set of experimental calculations were performed increasing the via diameter by approximately 50%. In this configuration the diameter of each via was increased from 30 mil to 46 mils. However, the impedance decreased by approximately 10%. A decrease of 10% is not currently considered sufficient to justify commercial implementation.

Figure 4:
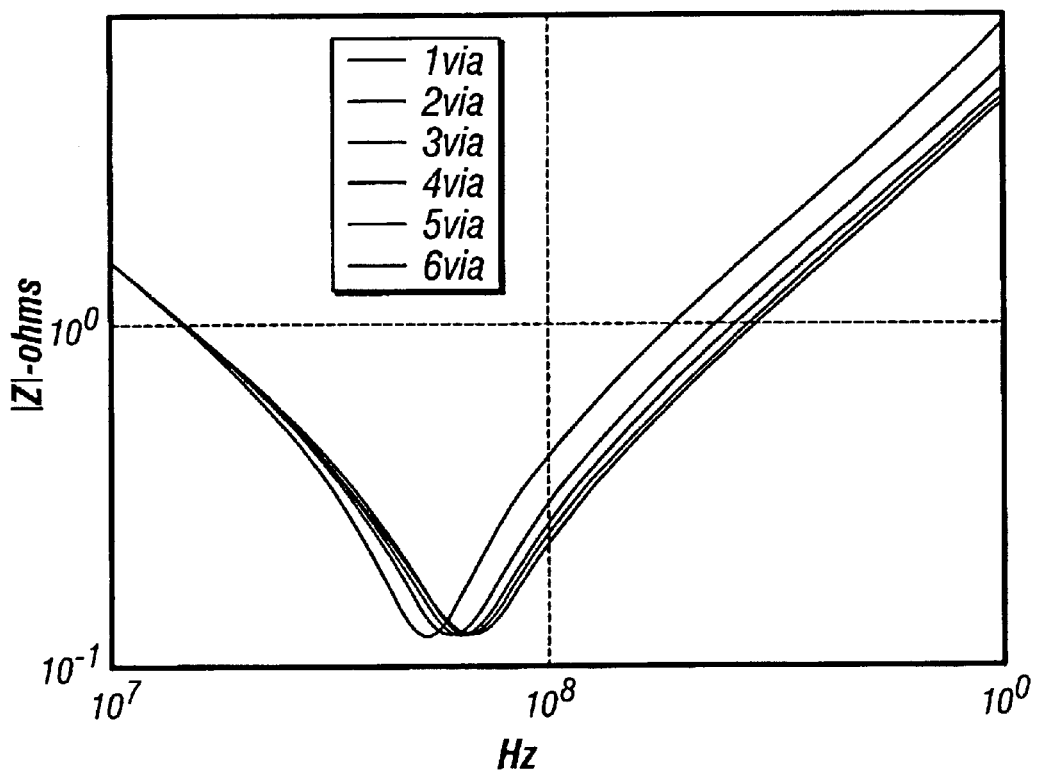
FIG. 4 is a graph showing predicted experimental results. The graph shown in FIG. 4 plots impedance of a surface mounted capacitance versus operating frequency.

In another experiment, the number of via were increased. The number of connections from the voltage pad to the ground pad were held constant. The experiment predicted the impedance of a capacitor with the number of via increased from one (a reference condition) to six in increments of one. As shown in FIG. 4, for a frequency less than approximately $0.8 \times 10^8$ Hz, the impedance decreased for a capacitor having two via from approximately 1.25 ohms to less than 0.50 ohms, a decrease of over 50%. As shown in FIG. 4, the decrease in impedance in the operating range below 100 MHz was greater for a capacitor having two via than for a capacitor having only one via. As shown in FIG. 4, the decrease in impedance was greater for a capacitor having 3, 4, 5 and 6 via in the range below 100 Mz. This decrease is considered to be sufficient for commercial implementation.

Still referring to FIG. 4, it can be seen that for an operating frequency above approximately 400 MHz the impedance of capacitors having mutiple via again increases. However, the operating range from 100 MHz to 400 MHz is of particular importance in the design of computers at this time. And it can be seen from FIG. 4 that above 400 MHz the impedance of multiple via conductors is less than the impedance of a single impedance conductor. Referring now to Table 1 below a comparison is provided of a capacitor having multiple via in the operating range represented by FIG. 4. Table 1 shows that in an operating range of 100 MHz to 400 MHz increasing the number of via decreases the impedance of a capacitor.

Referring to Table 1, a 0.01 $\mu$F capacitor operating at 100 MHz having one via has an inductance of 0.3013 Henrys. The same capacitor having two via operating at the same frequency has an inductance of 0.4192 Henrys. Thus the decrease for the capacitor operating at 100 MHz is over 20%. Again compare the same capacitor operating at 133 MHz. The 1.01 $\mu$F capacitor having one via has an inductance of 0.638 Henrys compared to a capacitor having two via which has an inductance of 0.4742 Henrys. Again, increasing the number of via decreases inductance of the same capacitor by over 20%. Finally, compare the decrease in impedance for the 0.01 $\mu$F capacitor operating at 400 MHz. The capacitor having one via is predicted to have an inductance of 2.273 Henrys compared to a capacitor having two via which has an inductance of 1.737 Henrys, again over a 20% reduction.

TABLE 1

| Number of via | 100 MHz | 133 MHz | 400 MHz |
| --- | --- | --- | --- |
| 1 | 0.4192 | 0.638 | 2.273 |
| 2 | 0.3013 | 0.4742 | 1.737 |
| 3 | 0.2637 | 0.4204 | 1.561 |
| 4 | 0.2454 | 0.3938 | 1.474 |
| 5 | 0.2347 | 0.378 | 1.427 |
| 6 | 0.2276 | 0.3675 | 1.392 |

Referring again to Table 1 it can be seen that increasing the number of via from 5 to 6 decreases the inductance from 1.427 Henrys to 1.392 Henrys, approximately a 3% reduction. Although the reduction in impedance is smaller in higher frequencies and for higher number of via it can be seen increasing the number of via decreases the impedance from at least 100 MHz to 400 MHz. The decrease in impedance is accomplished for up to six via coupling the ground pad to the ground plane, or other reference voltage plane.

Figure 1:
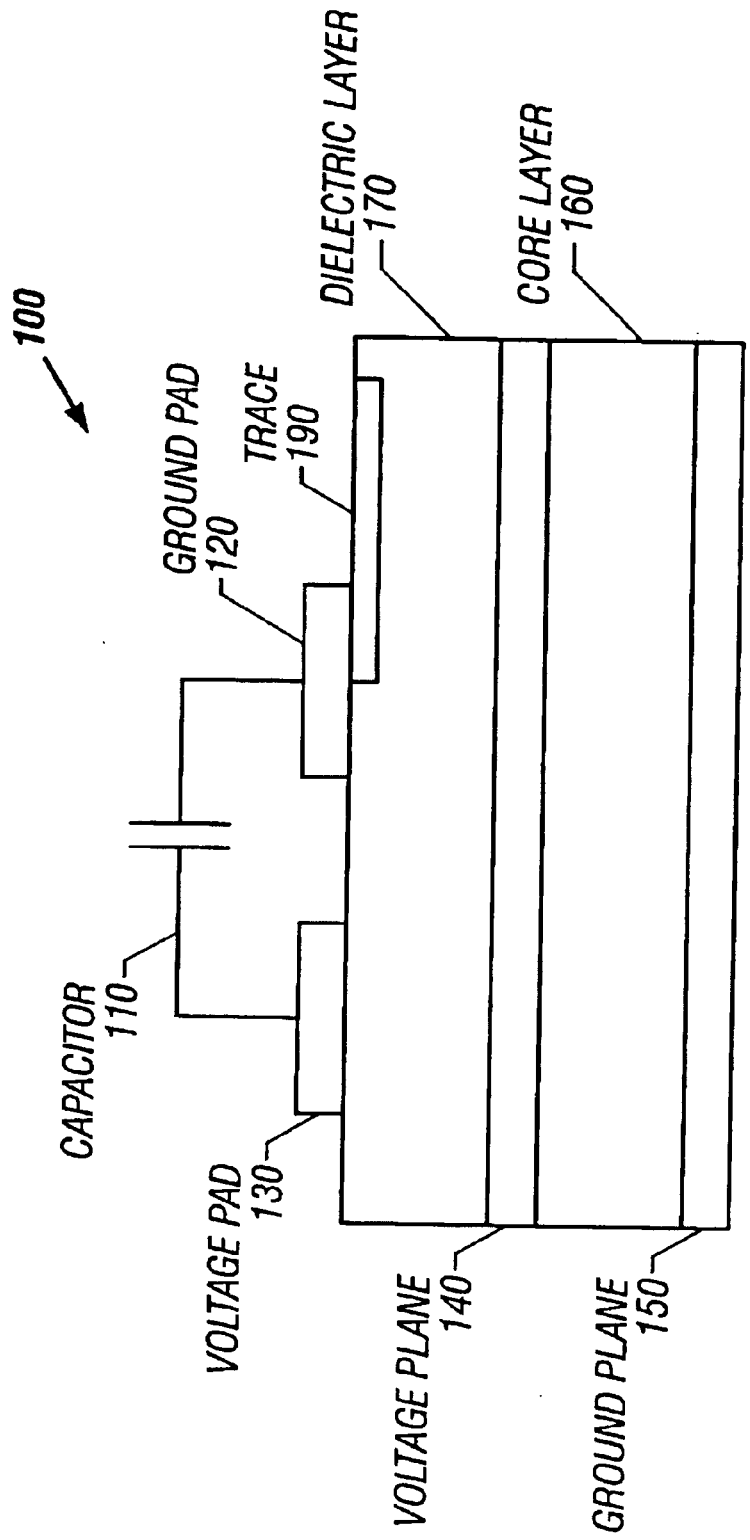
FIG. 1 shows a cross-sectional view of a capacitor installed on an integrated circuit board as known in the related art.
Figure 5A:
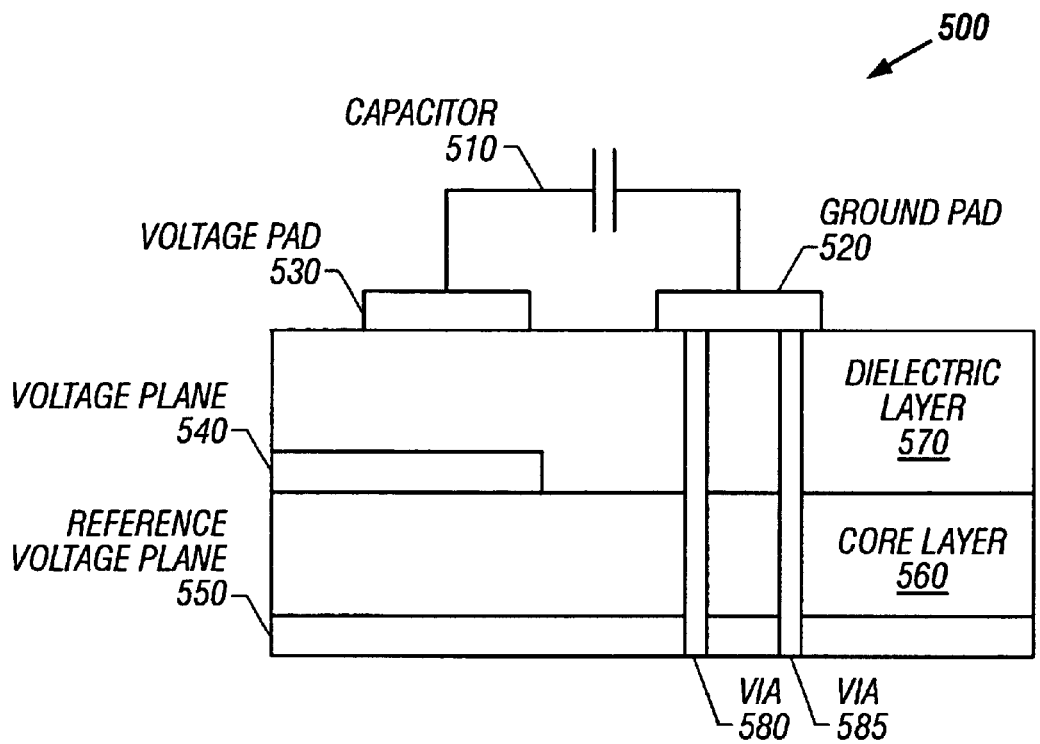
FIG. 5A shows a cross-sectional view of a printed circuit board including a capacitor having a plurality of via coupling the ground pad to the reference voltage plane.

FIG. 5A (similar to FIG. 1, shown previously) again shows a cross-sectional view of a capacitor in an operational configuration on integrated circuit board 500. In the configuration shown in FIG. 5A, the integrated circuit board again includes the following; dielectric layer 570, voltage plane 540 and core 560. In this configuration the integrated circuit includes reference voltage plane 500. In one embodiment, reference voltage plane 550 is a ground plane. As before, voltage plane 540 and reference voltage plan 550 are adjacent and parallel. Voltage plane 540 and reference voltage plane 550 are again separated by core layer 560. However, in the configuration shown in FIG. 5A via 580 and 585 are provided to reduce impedance of capacitor 510.

Still referring to FIG. 5A, capacitor 510 is electrically coupled to voltage pad 530 and ground pad 520. Voltage pad 530 is electrically coupled to voltage plane 540 by some means (not shown). The means of electrically coupling the voltage pad to the voltage plane can be a trace embedded in the surface of the integrated circuit board, a via through the planar surfaces of the integrated circuit board, or any other suitable means. Similarly, ground pad 520 is also electrically coupled to ground plane 550 by via 580.

As shown in FIG. 5A, via 580 electrically couples capacitor 510 to reference voltage plane 550. Via 580 is shown penetrating various layers of the circuit board including dielectric layer 570 and core layer 560. As shown in FIG. 5A via 580 does not penetrate voltage plane 540. Directly contacting voltage plane 540 would create a short circuit and thus render capacitor 510 inoperative and ineffective.

Figure 5B:
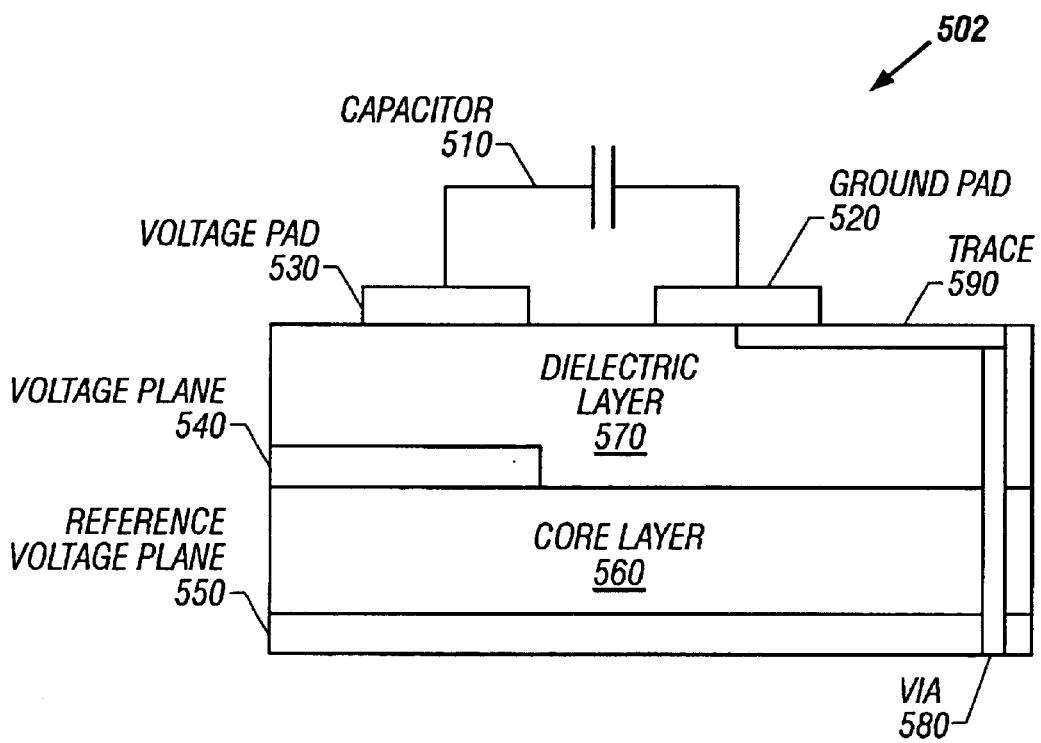
FIG. 5B shows a cross-sectional view of the printed circuit board (as previously shown in FIG. 5A) having a ground pad and trace coupling the capacitor to the reference voltage plane.

FIG. 5B illustrates one embodiment of the present disclosure. FIG. 5B shows a portion of printed circuit board 502. In the embodiment depicted in FIG. 5B, trace 590 is shown embedded in the surface of printed circuit board 502. In the embodiment shown in FIG. 5B, ground pad 520 is electrically coupled to trace 590 which has a reduced length to minimize inductance. Trace 590 is electrically coupled to via 580. As previously discussed (refer to Equation 1) reducing the inductance of trace 590 reduces overall impedance. FIG. 5C shows a portion of the printed circuit board previously shown in FIG. 5B including ground plane 551. In this enablement, ground plane 551 replaces reference voltage plane 550.

FIG. 6A shows a configuration of a capacitor according to one embodiment. FIG. 6A shows electrical coupling 610 which facilitates electrical coupling of capacitor 510 to a voltage plane. Voltage pad 530, capacitor 510 and ground pad 520 are as previously shown in FIG. 5A (and FIG. 5B). Similarly Via 580 and via 585 are shown in FIG. 6A. FIG. 6B shows an embodiment of the disclosure, a minimum size of ground pad 520. As shown in FIG. 6B, ground pad 520 can be rectangular shaped. Experiments have shown a minimum size of 0.10 inch length and 0.10 length width facilitates reducing the inductance of the capacitor. As shown by Equation 1, above, reducing the inductance also reduces the impedance, thereby reducing the need for additional capacitors.

FIGS. 7A and 7B depict embodiments of a method by which the present disclosure can be practiced. FIG. 7A depicts method 700 which can include: providing a first voltage plane 710, providing a second voltage plane 720, providing a core layer 730, providing a dielectric layer 740, providing a capacitor 750, providing a ground pad 760 and providing via 770. A trace (such as trace 590 in FIG. 5B) is provided, 765 The trace electronically couples a ground pad (such as ground pad 520 in FIG. 5B) to a via (such as via 580 in FIG. 5B). In logical step 775 a plurality of via are provided, the number of via from one to six, the number of via coupling the capacitor to the second voltage plane not equal to the number of electronic connections from the voltage pad to the voltage plane. As previously discussed (refer to FIGS. 3 and 4), providing a plurality of via decreases the impedance of the capacitor provided in step 750.

Figure 7C:
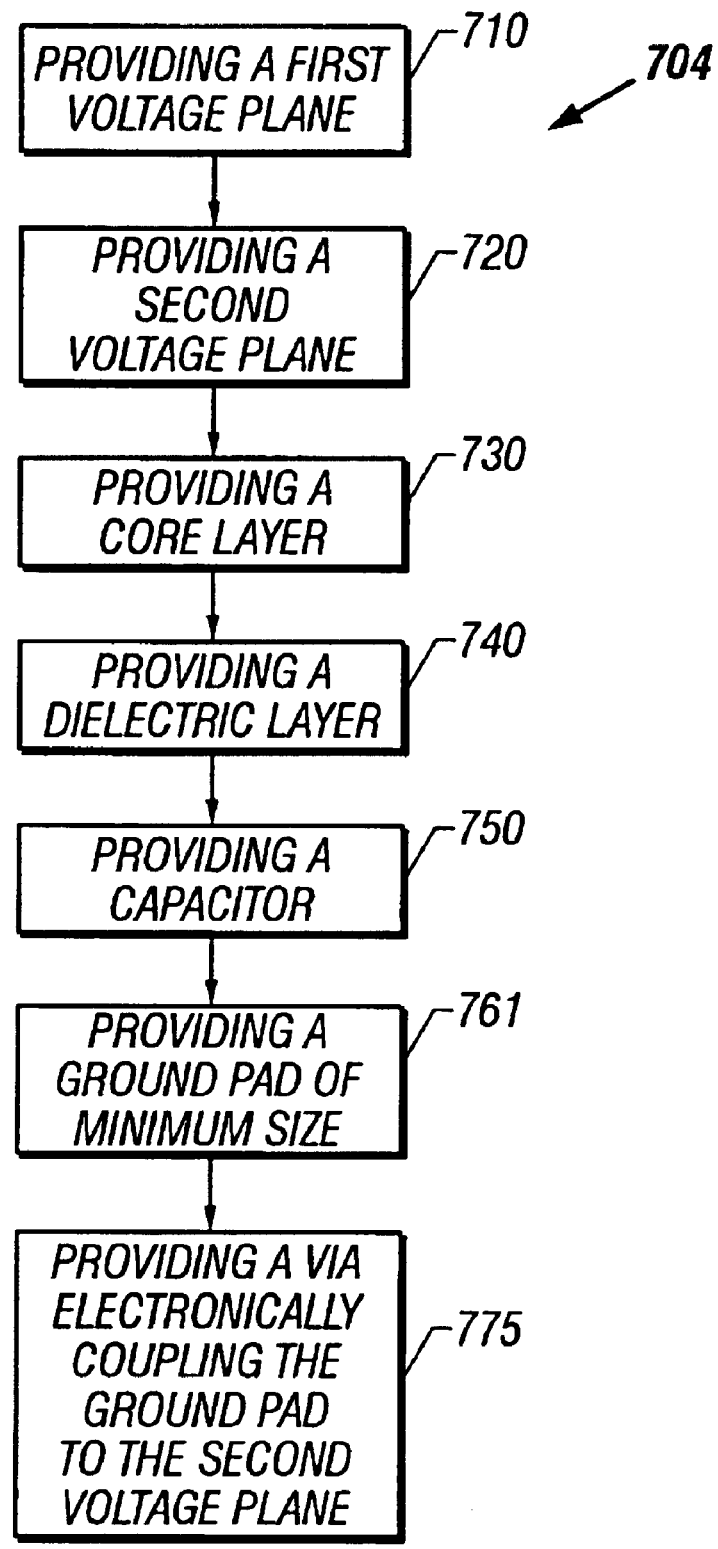

FIG. 7B depicts an embodiment of the method. However in FIG. 7B the step of providing a trace is not shown. In this embodiment reduction of inductance is achieved by eliminating the trace. Similarly, FIG. 7C depicts another embodiment. In the embodiment shown in FIG. 7C the reduction of inductance is achieved by providing a ground pad of minimum size.

Figure 8:
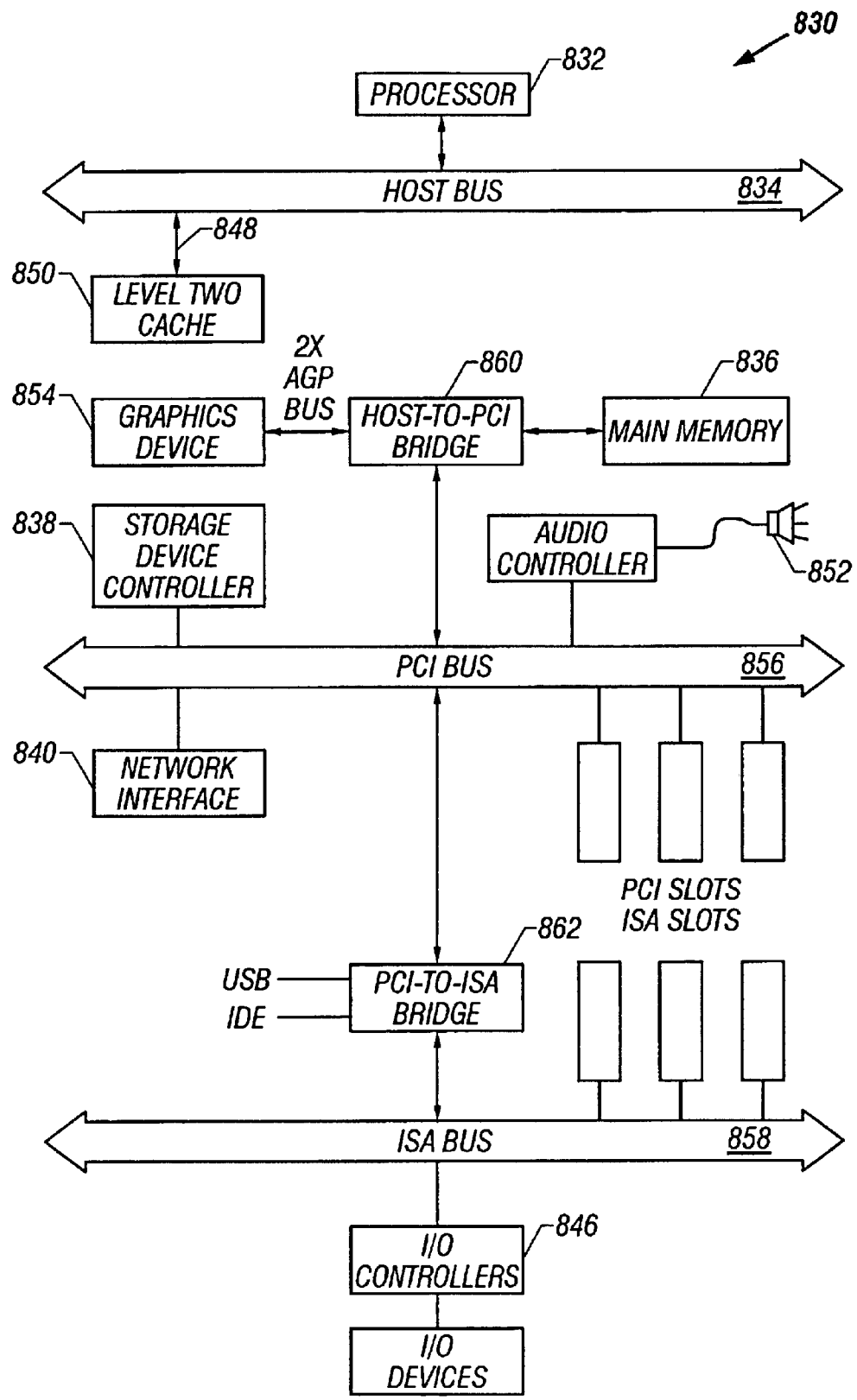
FIG. 8 is a block diagram of a computer system. The computer system incorporates various components (central processing unit, memory, audio controller, etc.) which are integrated circuits which may be manufactured fabricated using features of the disclosure.

An integrated circuit board designed or manufactured by the method taught by the present disclosure can be incorporated in a computer system, such as the computer system described in FIG. 8. In addition, the method taught in the present disclosure is applicable to manufacture integrated circuit boards which are to be included in a data processing system or any other electrical system not limited to a computer system such as shown in FIG. 8.

Referring to FIG. 8, computer system 830 includes central processing unit (CPU) 832 connected by host buss 834 to various components including main memory 836, storage device controller 838, network interface 840, audio and video controllers 842, and input/output devices 844 connected via input/output (I/O) controllers 846. Typically computer system 830 also includes cache memory 850 to facilitate quicker access between processor 832 and main memory 836. I/O peripheral devices often include speaker systems 852, graphics devices 854, and other I/O devices 844 such as display monitors, keyboards, mouse-type input devices, floppy and hard disk drives, DVD drives, CD-ROM drives, and printers. Many computer systems also include network capability, terminal devices, modems, televisions, sound devices, voice recognition devices, electronic pen devices, and mass storage devices such as tape drives. The number of devices available to add to personal computer systems continues to grow, however computer system 630 may include fewer components than shown in FIG. 8 and described herein. The peripheral devices usually communicate with processor 832 over one or more busses 834, 856, 858, with the busses communicating with each other through the use of one or more bridges 860, 862.

Those of skill in the art will recognize that, based upon the teachings herein, several modifications may be made to the embodiments shown in FIGS. 1–8. For example, those skilled in the art will recognize that incorporating integrated circuit boards manufactured by the process shown in electrical systems other than computers systems is incorporated in the spirit and scope of the invention. For example, integrated circuit boards may be found in many components of a typical computer system, for example a central processing unit, memory, cache, audio controller, network interface, I/O controller and I/O device as shown in the example below. Integrated circuits are found in other components within a computer system such as a display monitor, keyboard, floppy and hard disk drive, DVD drive, CD-ROM and printer. However, the example of a computer system is not taken to be limiting. Integrated circuits are ubiquitous and are found in other electrical systems such as stereo systems and mechanical systems including automobiles and aircraft.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A computer system, comprising:
   the central processing unit operably coupled to the memory; and
   an integrated circuit board, the integrated circuit board comprising:
   a first voltage plane;
   a second voltage plane, wherein the second voltage plane is parallel to the first voltage plane;
   a core layer operably disposed between the first voltage plane and second voltage plane;
   a dielectric layer operably disposed on a portion of the first voltage plane;
   a ground pad, wherein the ground pad is operably disposed on the dielectric layer;
   a capacitor, wherein the capacitor is operably disposed on the ground pad;
   a voltage pad, the voltage pad electrically coupled to the first voltage plane; and
   a via, the via electrically coupling the ground pad to the second voltage plane.

2. The computer system as recited in claim 1, wherein the capacitor is a surface mounted capacitor.

3. The computer system as recited in claim 1, wherein the capacitor is a bypass capacitor.

4. The computer system as recited in claim 1, wherein the number of via is less than or equal to six and not equal to the number of electrical connections from the voltage pad to the first voltage plane.

5. The computer system as recited in claim 1, wherein the operating frequency of the capacitor is greater than or equal to 100 Mhz.

6. The computer system as recited in claim 5, wherein the operating frequency of the capacitor is less than or equal to 800 Mhz.

7. The computer system as recited in claim 1, wherein the ground pad has a length and a width, wherein the ground pad is a minimum of 0.1 inches in width.

8. The computer system as recited in claim 7, wherein the ground pad is a minimum of 0.1 inches in length.

9. An integrated circuit board designed to reduce the inductance of a capacitor, comprising:
  a first voltage plane;
  a second voltage plane, wherein the second voltage plane is parallel to the first voltage plane;
  a core layer operably disposed between the first voltage plane and the second voltage plane;
  a dielectric layer, wherein the dielectric layer is operably disposed on a portion of the first voltage plane;
  a ground pad, wherein the ground pad is operably disposed on the dielectric layer;
  a trace, the trace electrically coupled to the ground pad;
  a capacitor, wherein the capacitor is operably disposed on the ground pad;
  a voltage pad, the voltage pad electrically coupled to the first voltage plane; and
  a plurality of via, the plurality of via electrically coupling the trace to the second voltage plane, the number of via greater than the number of electrical couplings between the voltage pad and the first voltage plane.

10. The integrated circuit board as recited in claim 9, wherein the capacitor is a bypass capacitor.

11. The integrated circuit board as recited in claim 9, wherein the capacitor is a surface mounted capacitor.

12. The integrated circuit board as recited in claim 9, wherein the number of via is less than or equal to six and not equal to the number of electrical couplings from the voltage pad to the voltage plane.

13. The integrated circuit board as recited in claim 9, wherein the operating frequency of the capacitor is greater than or equal to 100 Mhz.

14. The integrated circuit board as recited in claim 13, wherein the operating frequency of the capacitor is less than or equal to 800 Mhz.

15. The integrated circuit board as recited in claim 9, further comprising:
  a ground pad, wherein the ground pad has a width and a length, wherein the minimum length of the ground pad is 0.1 inch.

16. The integrated circuit board as recited in claim 15, wherein the ground pad has a width and a length, wherein the minimum width of the ground pad is 0.1 inch.

17. A method of designing an integrated circuit board to reduce the inductance of a capacitor, comprising:
  providing a first voltage plane;
  providing a second voltage plane, wherein the second voltage plane is parallel to the first voltage plane;
  providing a core layer, the core layer operably disposed between the first voltage plane and the second voltage plane;
  providing a dielectric layer, wherein the dielectric layer is operably disposed on a portion of the first voltage plane;
  providing a ground pad, the ground pad operatively disposed on the dielectric layer;
  providing a capacitor, the capacitor operably disposed on the ground pad;
  providing a voltage pad, the voltage pad electrically coupled to the first voltage plane; and
  providing a via, the via electrically coupling the ground pad to the second voltage plane.

18. The method of designing an integrated circuit board as recited in claim 17, wherein the capacitor is a bypass capacitor.

19. The method of designing an integrated circuit as recited in claim 17, wherein the capacitor is a surface mounted capacitor.

20. The method of designing an integrated circuit as recited in claim 17, wherein the number of via are less than or equal to six and not equal to the number of electrical couplings from the voltage pad to the voltage plane.

21. The method of designing an integrated circuit board as recited in claim 17, wherein the capacitor operates at a frequency greater than or equal to 100 Mhz.

22. The method of designing an integrated circuit board as recited in claim 21, wherein the capacitor operates at a frequency less than or equal to 800 Mhz.

23. The method of designing an integrated circuit board as recited in claim 17, wherein the ground pad is a rectangular shape, the ground pad having a minimum length of 0.10 inch.

24. The method of designing an integrated circuit board as recited in claim 23, wherein the ground pad is a minimum width of 0.10 inch.

25. A method of designing an integrated circuit board to reduce the inductance of a capacitor, comprising:
  providing a first voltage plane,
  providing a second voltage plane, wherein the second voltage plane is parallel to the first voltage plane;
  providing a core layer, the core layer operably disposed between the first voltage plane and the second voltage plane;
  providing a dielectric layer, wherein the dielectric layer is operably disposed on a portion of the first voltage plane;
  providing a ground pad, the ground pad operatively disposed on the dielectric layer;
  providing a trace, the trace electrically coupled to the ground pad;
  providing a capacitor, the capacitor operably disposed on the ground pad;
  providing a voltage pad, the voltage pad electrically coupled to the first voltage plane; and
  providing a via, the via electrically coupling the trace to the second voltage plane, the number of via less than six and the number of via greater than the number of electrical couplings between the voltage pad and the first voltage plane.

26. The method of designing an integrated circuit board as recited in claim 25, wherein the capacitor is a bypass capacitor.

27. The method of designing an integrated circuit as recited in claim 26, wherein the capacitor is a surface mounted capacitor.

28. The method of designing an integrated circuit board as recited in claim 25, wherein the capacitor operates at a frequency greater than or equal to 100 Mhz.

29. The method of designing an integrated circuit board as recited in claim 28, wherein the capacitor operates at a frequency less than or equal to 800 Mhz.

30. The method of designing an integrated circuit board as recited in claim 25, wherein the ground pad has a width and a length, the ground pad having a minimum length of 0.10 inch.

31. The method of designing an integrated circuit board as recited in claim 30, wherein the ground pad has a minimum width of 0.10 inch.

* * * * *